United States Patent
Suzuki (10) Patent No.: US 7,355,895 B2
(45) Date of Patent: Apr. 8, 2008

(54) NONVOLATILE SEMICONDUCTOR MEMORY AND DRIVING METHOD THE SAME

(75) Inventor: Junichi Suzuki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 43 days.

(21) Appl. No.: 11/090,273

(22) Filed: Mar. 28, 2005

(65) Prior Publication Data

US 2005/0213382 A1    Sep. 29, 2005

(30) Foreign Application Priority Data

Mar. 29, 2004  (JP) .............. 2004-095458

(51) Int. Cl.
*G11C 16/04* (2006.01)
(52) U.S. Cl. ............ 365/185.29; 365/189.04; 365/230.01
(58) Field of Classification Search ........... 365/230.01, 365/189.04, 185.29
See application file for complete search history.

(56) References Cited

U.S. PATENT DOCUMENTS

| | | | | |
|---|---|---|---|---|
| 6,335,878 B1 * | 1/2002 | Yamada et al. | ........ | 365/185.03 |
| 6,477,632 B1 * | 11/2002 | Kikuchi | ................. | 365/185.29 |
| 6,523,105 B1 * | 2/2003 | Haneda | ...................... | 711/209 |
| 2002/0083262 A1 * | 6/2002 | Fukuzumi | ................... | 711/103 |
| 2002/0124130 A1 * | 9/2002 | Iida et al. | .................. | 711/103 |
| 2002/0168816 A1 * | 11/2002 | Shibata | ...................... | 438/233 |
| 2004/0027901 A1 * | 2/2004 | Shiga et al. | ............... | 365/222 |

FOREIGN PATENT DOCUMENTS

| | | |
|---|---|---|
| JP | 09-97884 | 4/1997 |
| JP | 2002-118184 A | 4/2002 |

OTHER PUBLICATIONS

"Flash Memory Guide Book, Chapter 2," (URL:http://flash.ignet.co.jp/product/guide/duide02.html, retrieved Mar. 4, 2004.

* cited by examiner

*Primary Examiner*—Thong Q. Le
(74) *Attorney, Agent, or Firm*—Foley & Lardner LLP

(57) ABSTRACT

A nonvolatile semiconductor memory includes a memory cell array, a control circuit and an address control circuit. In the memory cell array, a plurality of memory cells are arranged in a matrix of rows and columns. The control circuit sets a write/erase mode in response to an erase instruction, and to count the erase instruction. The address control circuit generates a write address from an input address for a write operation based on a count value from the control circuit in the write/erase mode. A write order to the memory cells accessed based on a series of the write addresses in a current write operation is different from a write order to the memory cells accessed based on a series of write addresses in a previous write operation.

19 Claims, 9 Drawing Sheets

NONVOLATILE SEMICONDUCTOR MEMORY AND DRIVING METHOD THE SAME

BACKGROUND OF THE INVENTION

1. Field of the Invention

The present invention relates to a nonvolatile semiconductor memory, and a driving method of the same.

2. Description of the Related Art

Figure 1:
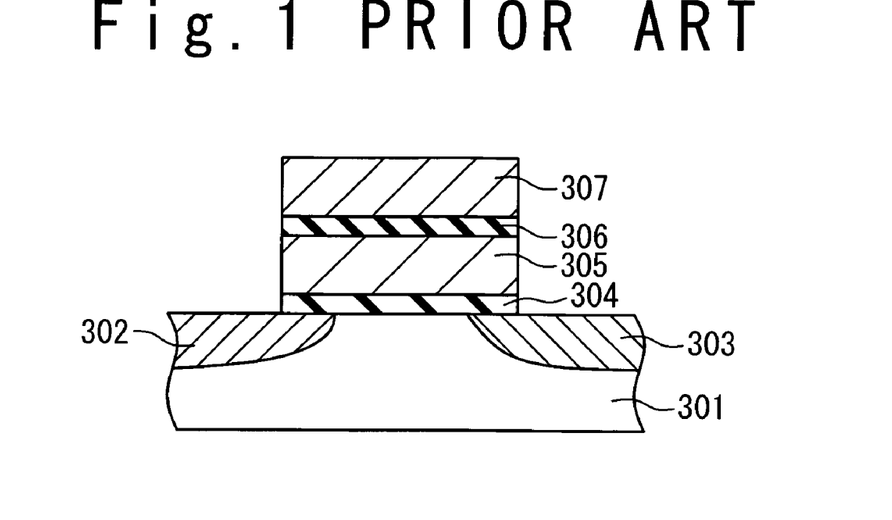
FIG. 1 is a cross sectional view of a conventional memory cell in a flash memory.

Generally, a memory cell in an EEPROM (Electrically Erasable Programmable Read Only Memory) or a Flash memory is composed of a MOS (Metal Oxide Semiconductor) transistor shown in FIG. 1. As shown in FIG. 1, a source 302 and a drain 303 are formed in the surface of a semiconductor substrate 301 in the memory cell. A floating gate 305 is formed on the semiconductor substrate 301 through a tunnel oxide film 304. In addition, a control gate 307 is formed on the floating gate 305 through an insulating film 306. For instance, in "Flash Memory Guide Book, Chapter 2", (URL: http://flash.iqnet.co.jp/product/guide/duide02.html, retrieved on the Mar. 4, 2004)>, the following conventional technique is described. That is, an n-type source and an n-type drain are formed in a p-type silicon substrate. A floating gate is formed on the p-type silicon semiconductor substrate through a tunnel oxide film. Moreover, a control gate is formed on the floating gate through an insulating film. Thus, a MOS transistor is formed.

Figure 2:
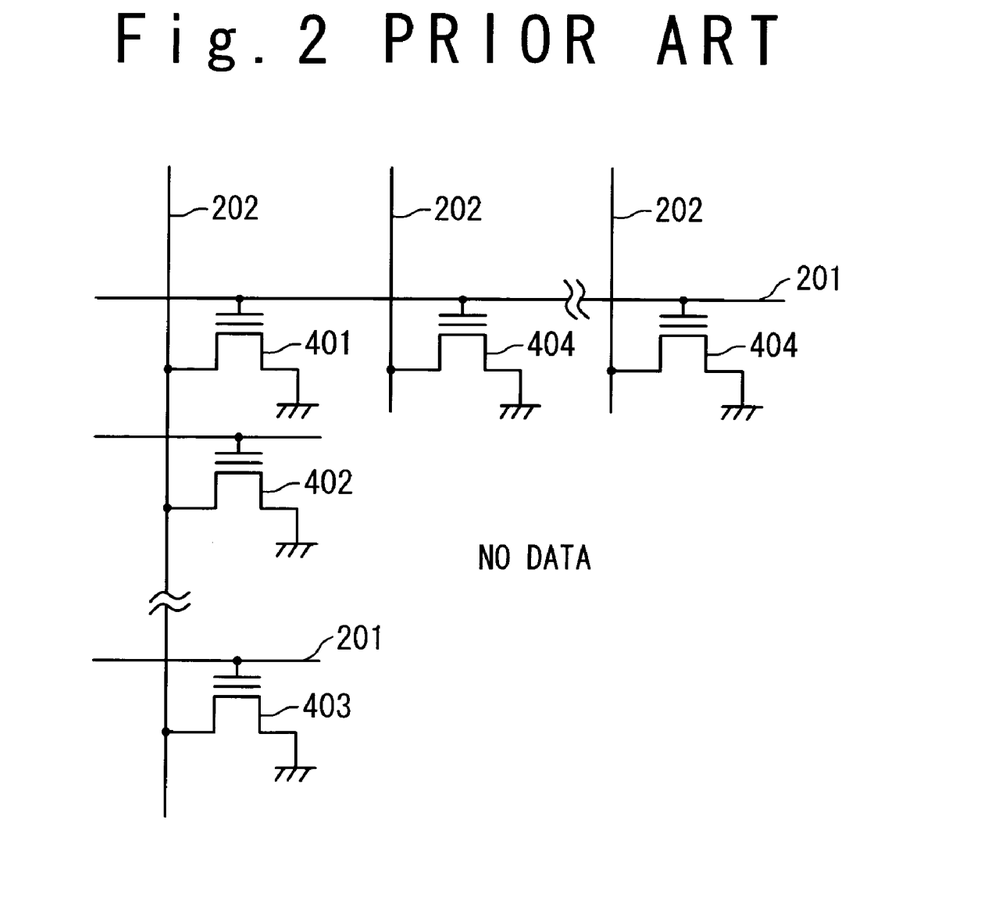
FIG. 2 is a diagram showing an array of a conventional NOR type flash memory for one bit line and one word line.

FIG. 2 is a diagram showing an array of a NOR type flash memory for one bit line and one word line. Drains of a plurality of memory cells 401, 402, and 403 are commonly connected with a same bit line 202. In such a configuration, for instance, it is supposed that data has been written in the memory cell 401, a writing operation is being carried out to the memory cell 402, and no data is written in the memory cell 403. In this case, each of the memory cells 401, 402, and 403 is connected to a word line extending in a row direction together with other memory cells.

Figure 3A:
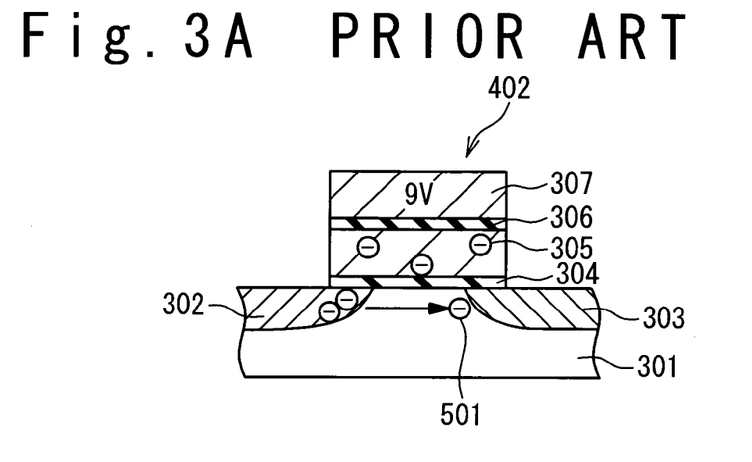
FIGS. 3A to 3C are diagrams showing electric charge stored states of each memory cell of the conventional NOR type flash memory.
Figure 3B:
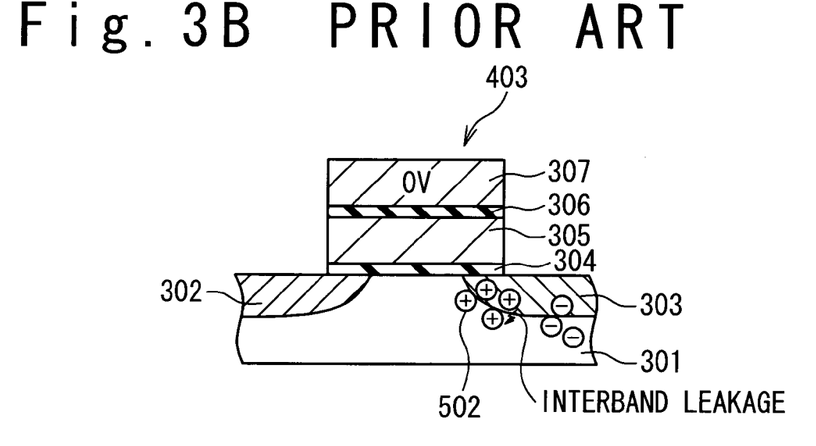
Figure 3C:
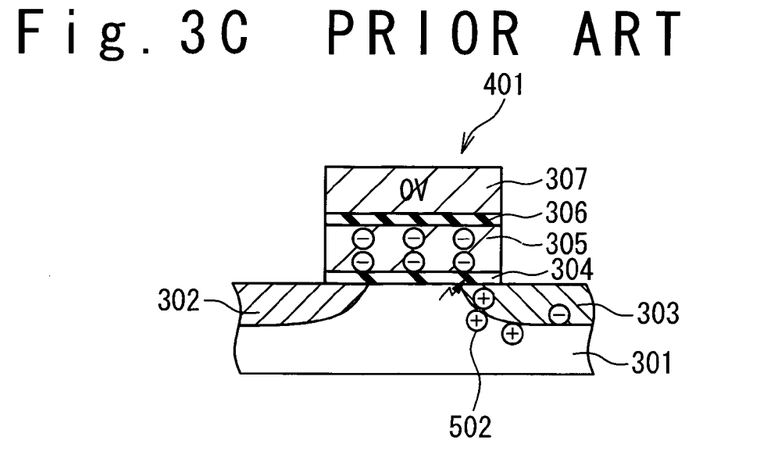

FIGS. 3A to 3C are diagrams showing electric charge stored states of each memory cell of the NOR type flash memory. FIG. 3A shows the electric charge stored state of the memory cell 402 in which data is being written. FIG. 3B shows the electric charge stored state of the memory cell 403 in which no data is written. FIG. 3C shows the electric charge stored state of the memory cell 401 in which data has been written. Here, when data is written in the memory cell 402, the bit line 202 is selected and the voltage of 3V to 5V is applied to the bit line 202. Also, as shown in FIG. 3A, the voltage of 9V is applied between the control gate 307 and the drain 303 in the memory cell 402, so that channel hot electrons 501 are generated. The channel hot electrons 501 are injected into the floating gate 305 of the memory cell 401 because of the gate voltage and stored therein. At this time, as shown in FIG. 2, the bit line voltage is applied to the drains of memory cells 401 to 403 connected with the same bit line 202. However, the gate voltage is not applied to the memory cells 401 and 403. In this case, since the bit line voltage to be applied to the drains of the memory cells 401 to 403 is a relatively high voltage (3V to 5V), an interband leak between the drain and the channel region is generated, as shown in FIGS. 3B and 3C. Although holes 502 are generated at this time, the holes 502 causes no problem in the memory cell in which no data is written. However, in the memory cell 401 in which data has been written, the holes 502 are attracted by the negative electric charge stored in the floating gate 305, and injected into the tunnel oxide film 304. As a result, the tunnel oxide film 304 is damaged.

Also, the tunnel oxide films of other memory cells 404 are damaged, which are connected with the same word line 201 as the memory cell 402. The bit line voltage is not applied to the other memory cells 404, which are connected with the same word line 201 as the memory cell 402, but only the word line voltage is applied. That is, only the gate voltage is applied. As a result, the electrons are injected into the tunnel oxide film 304 so as to be damaged.

Figure 4A:
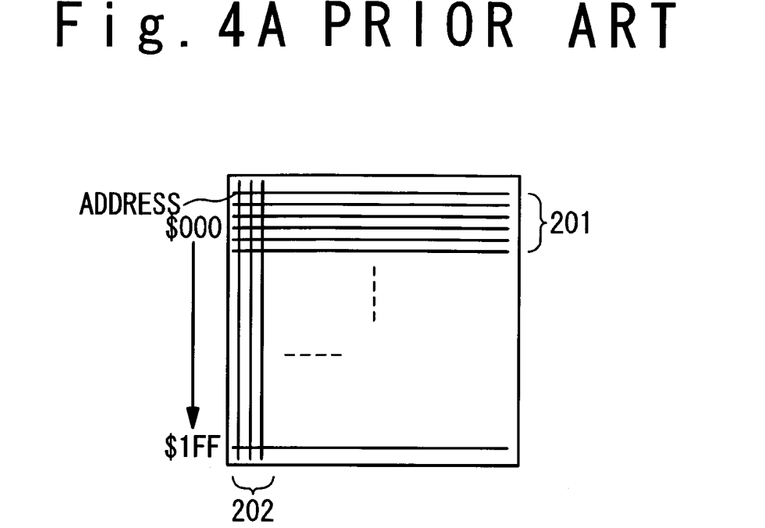
FIG. 4A is a diagram showing a memory cell array of the conventional flash memory.
Figure 4B:
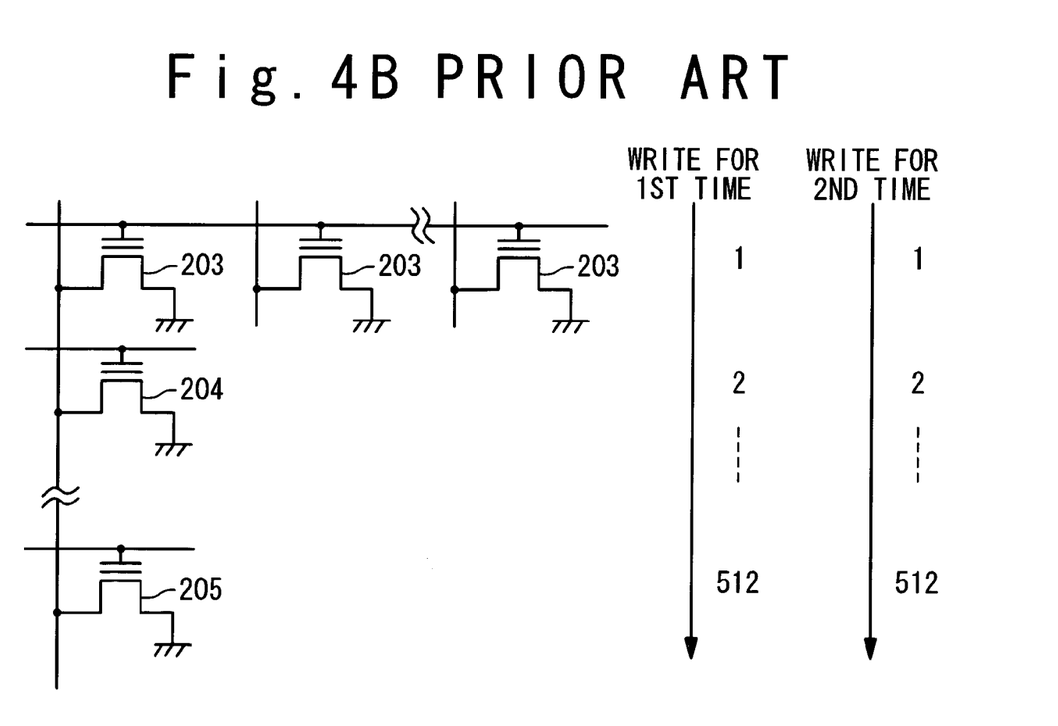
FIG. 4B to 4C are a schematic diagram showing an outline of the array with 512 memory cells for each bit line.
Figure 4C:
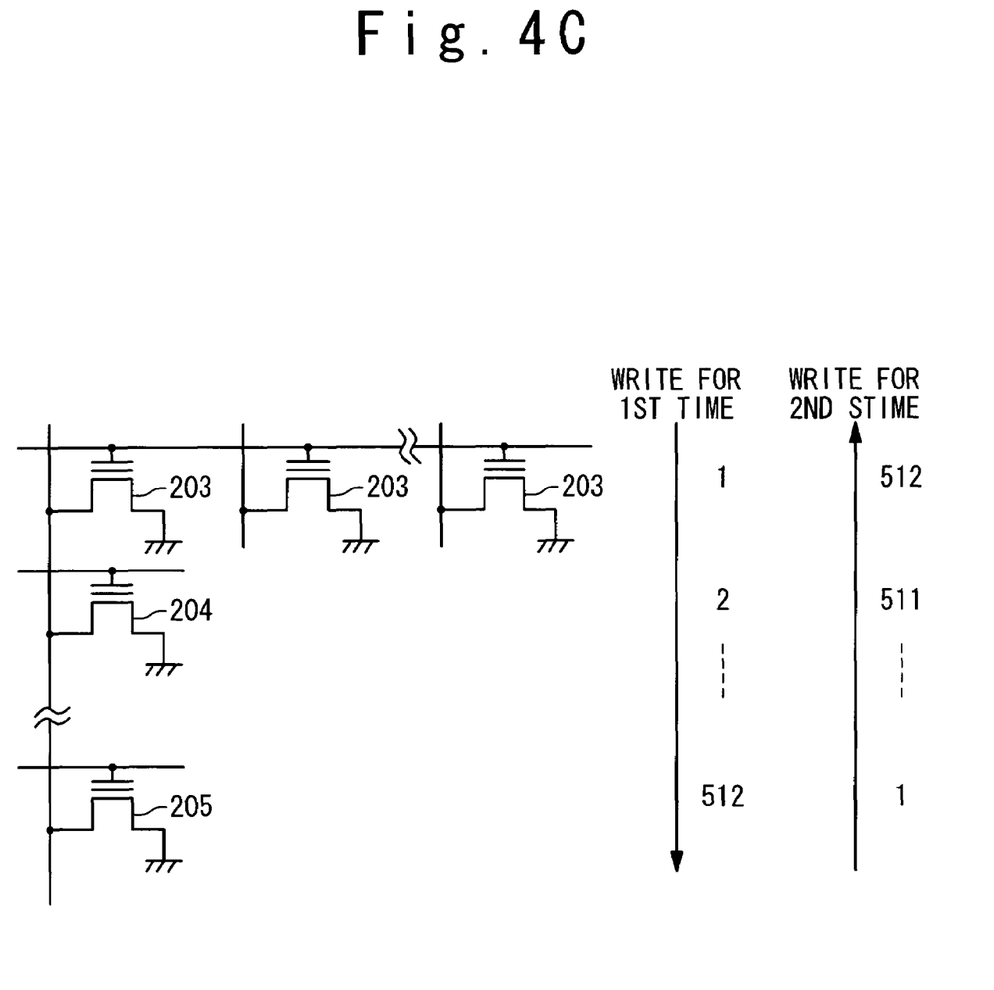

FIG. 4A is a diagram showing a memory cell array of the flash memory. FIG. 4B is a schematic diagram showing an outline of the array with 512 memory cells for each bit line. In the flash memory, when the electrons are excessively drawn out from the floating gate in an erasing operation, the floating gate is changed into a positive charge state, and the threshold of the memory cell transistor becomes negative. As a result, the operation of the transistor cannot be carried out normally, that is, an excessive erasing is caused. In order to prevent the excessive erasing, a writing operation is carried out to all the memory cells before the erasing operation, to stop the erasing operation in the most preferable erasure level. In such a writing operation before the erasing operation, the writing operation is generally carried out in a direction from the most significant bit (uppermost) address to the least significant bit (lowermost) address, namely, the address ($000) to the address ($1FF), as shown in FIG. 4A. In FIG. 4B, the writing operation is carried out in order from the memory cell 1, to the memory cell 2, the memory cell 3, ..., and the memory cell 512. That is to say, the writing operation always starts from the memory cell 1, and stops at the memory cell 512.

By the way, as electronic equipment of multi-function, high performance, and miniaturization in size has been developed, it is required that a memory should be further has a large storage capacity and a low-cost performance. In order to satisfy these requirements, two solutions can be proposed. One is to achieve the high integration by making the memory cell minute. The other is to increase the memory capacity for one memory cell by using a multi-value technology. The multi-value technology will be described below.

Figure 5A:
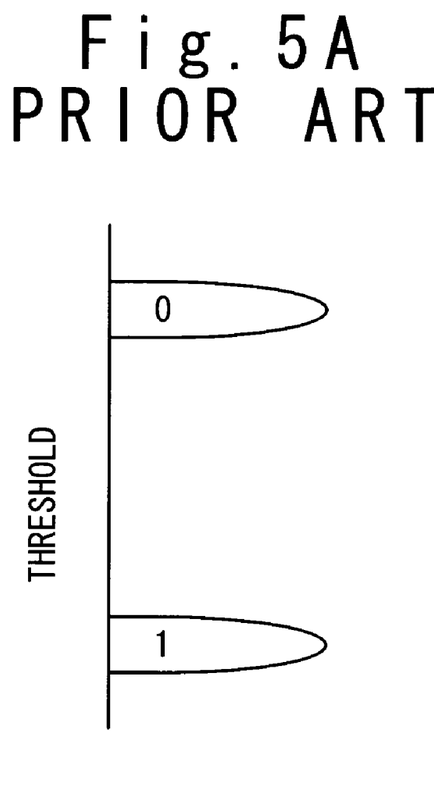
FIGS. 5A and 5B are diagrams showing a relation of the number of bits and the thresholds of the memory cell.
Figure 5B:
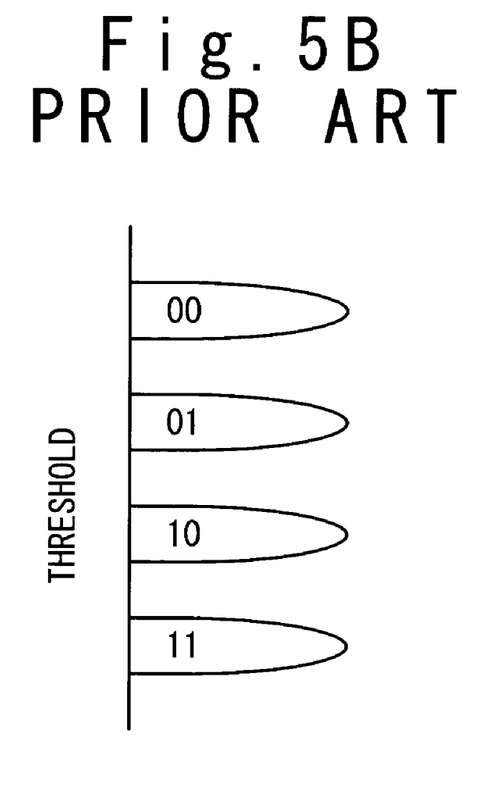

FIGS. 5A and 5B are diagrams showing a relation of the number of bits and the thresholds of the memory cell. The memory is usually operated in a binary manner. That is, as shown in FIG. 5A, 1-bit data is stored depending on whether the 1-bit data is "1" or "0". On the other hand, for instance, in the flash memory using the 4-value technology, the "high", "middle", "low", and "initial" thresholds of the memory cell are set to "11", "10", "01", and "00" of binary data. Therefore, one memory cell can store 2-bit data. Recently, numerous investment is needed for miniaturization of the memory cell. For this reason, the importance of the multi-value technology has been increased to make the memory capacity twice or more in the same integration.

In this way, in the EEPROM and the flash memory, the electric charge is stored in the floating gate 305 as shown in FIG. 1, to control the threshold of the memory cell transistor. In the binary technology, the threshold of the memory cell has only two states. However, in the 4-value technology, the memory cell must have four states. Therefore, the threshold of the memory cell transistor must be accurately controlled strictly. As a result, higher reliability is required for each memory cell.

However, the above-mentioned conventional nonvolatile memory has the following problems. As shown in FIG. 3C, the holes generated through the interband leakage between the drain and the channel region are attracted to the negative electric charge stored in the floating gate 305. As a result, a hole injection stress is generated, when the holes are injected into the tunnel oxide film. Thus, the tunnel oxide film receives serious damage.

In case of the flash memory shown in FIG. 4A, the writing operation before the erasing operation always starts from the memory cell 1 and ends at the memory cell 512. For this reason, when the writing operation is carried out to all the memory cells connected to the same bit line, the memory cell 1 receives the above-mentioned hole injection stress which is caused through the writing operation to the 511 remaining memory cells connected to the same bit line as the memory cell 1. On the other hand, the memory cell 512 does not receive the hole injection stress since the writing operation is carried out last. The writing/erasing operations are repeated tens of thousands of times or more in the flash memory. Therefore, the damage is compiled each time the writing/easing operation is repeated and becomes serious damage that should not be disregarded.

In this way, the hole injection stress caused due to the high voltage of the drain is applied nonuniformly depending on the position of the memory cell on the same bit line, since the order of the write addresses is always same. For instance, in FIGS. 3A to 3C, it is supposed that the writing/erasing operations are repeated 10,000 times and the writing operation is carried out to all the 512 memory cells on same bit line. In this case, under the above-mentioned condition, the memory cell 1 of the address ($000) receives the hole injection stress of "5,110,000 times*(an average write time per one memory cell)". On the other hand, the memory cell 512 of the address ($1FF) receives no hole injection stress. It should be noted that a problem of electron injection stress is caused in the memory cells on a same word line, similar to the above.

In conjunction with the above description, a nonvolatile semiconductor memory device is disclosed in Japanese Laid Open Patent Application (JP-A-Heisei 9-97884). In this conventional example, an impurity region of a second conductive type is formed in a semiconductor substrate of a first conductive type. A first insulating film is formed on the surface of the impurity region of the second conductive type, and an electric floating gate electrode is formed on the first insulating film. A control electrode is formed on the floating gate electrode through a second insulating film to overlap the floating gate in at least a part. A first source (drain) region of the first conductive type is formed in the impurity region of the second conductive type, and a second source (drain) region of the second conductive type is formed in the first source (drain) region of the first conductive type. A drain (or source) region of the first conductive type is formed in the impurity region of the second conductive type. In a write operation, electrons supplied from the semiconductor substrate of the first conductive type are accelerated by a depletion layer generated between the impurity region of the second conductive type and the first source (or drain) region of the first conductive type to be injected into the floating gate. Also, in an erasing operation, holes supplied from the impurity region of the second conductive type are accelerated by the depletion layer generated between the first source (drain) of the first conductive type (or) and the second source (drain) region of the second conductive type to be injected into the floating gate.

Also, a nonvolatile semiconductor memory device is disclosed in Japanese Laid Open Patent Application (JP-P2002-118184A). In this conventional example, a channel forming region of an N-type semiconductor is put between two source/drain regions of the p-type semiconductor. A gate insulating film is provided onto the channel forming region, and a gate electrode is provided onto the gate insulating film. An electric charge storage section is formed in a region opposing to the channel forming region and in the gate insulating film distributedly into the direction of the film thickness. A channel is formed in the channel forming region, and hot holes generated with electric field in the channel are injected into the electric charge storage section for a write operation. Also, hot electron are generated due to interband tunnel current between the source/drain regions, and are injected into the electric charge storage section holding the electrons for an erasing operation.

SUMMARY OF THE INVENTION

In an aspect of the present invention, a nonvolatile semiconductor memory includes a memory cell array, a control circuit and an address control circuit. In the memory cell array, a plurality of memory cells are arranged in a matrix of rows and columns. The control circuit sets a write/erase mode in response to an erase instruction, and to count the erase instruction. The address control circuit generates a write address from an input address for a write operation based on a count value from the control circuit in the write/erase mode. A write order to the memory cells accessed based on a series of the write addresses in a current write operation is different from a write order to the memory cells accessed based on a series of write addresses in a previous write operation.

Here, the write order in the current write operation may be opposite to the write order in the previous write operation in units of the rows of the memory cells. In this case, the address control circuit may be connected with address lines on which the input address having a row address portion and a column address portion is supplied. The address control circuit may include inverters connected to the address lines corresponding to the row address portion; a logic circuit configured to generate a switch control signal based on the count value in the write/erase mode; and switches, each of which outputs an inverted output of the inverter connected with a corresponding one of the address lines corresponding to the row address portion in response to the switch control signal. Also, the switches output the input address on the address lines as the internal address when the write/erase mode is not set.

Also, the write order in the current write operation may be opposite to the write order in the previous write operation in units of the columns of the memory cells. In this case, the address control circuit may be connected with address lines on which the input address having a row address portion and a column address portion is supplied. The address control circuit may include inverters connected to the address lines corresponding to the column address portion; a logic circuit configured to generate a switch control signal based on the count value in the write/erase mode; and switches, each of which outputs an inverted output of the inverter connected with a corresponding one of the address lines corresponding to the column address portion in response to the switch control signal. Also, the switches output the input address on the address lines as the internal address when the write/erase mode is not set.

Also, the write order in the current write operation may be opposite to the write order in the previous write operation. In this case, the address control circuit may be connected with address lines on which the input address having a row address portion and a column address portion is supplied. The address control circuit may include inverters connected to the address lines; a logic circuit configured to generate a switch control signal based on the count value in the write/erase mode; and switches, each of which outputs inverted outputs of the inverters in response to the switch control signal. Also, the switches output the input address on the address lines as the internal address when the write/erase mode is not set.

In another aspect of the present invention, a method of driving a nonvolatile semiconductor memory, is achieved by providing a memory cell array in which a plurality of memory cells are arranged in a matrix of rows and columns; by setting a write/erase mode in response to an erase instruction, and counting the erase instruction; and by generating a write address from an input address for a write operation based on the count value in the write/erase mode. In this case, a write order to the memory cells accessed based on a series of the write addresses in a current write operation is different from a write order to the memory cells accessed based on a series of write addresses in a previous write operation.

Here, the write order in the current write operation may be opposite to the write order in the previous write operation in units of the rows of the memory cells. In this case, the generating may be achieved by inverting address bits of a row address portion of the input address; and by generating as the internal address, the inverted address bits for the row address portion and non-inverted address bits for a column address portion in the write/erase mode. Also, the method may include generating the input address as the internal address when the write/erase mode is not set.

Also, the write order in the current write operation may be opposite to the write order in the previous write operation in units of the columns of the memory cells. The generating may be achieved by inverting address bits of a column address portion of the input address; and by generating as the internal address, non-inverted address bits for the row address portion and the inverted address bits for a column address portion in the write/erase mode. Also, the method may further include generating the input address as the internal address when the write/erase mode is not set.

Also, the write order in the current write operation may be opposite to the write order in the previous write operation. In this case, the generating may be achieved by inverting address bits of the input address; and by generating as the internal address, the inverted address bits in the write/erase mode. Also, the method may further include generating the input address as the internal address when the write/erase mode is not set.

DESCRIPTION OF THE PREFERRED EMBODIMENTS

Figure 6A:
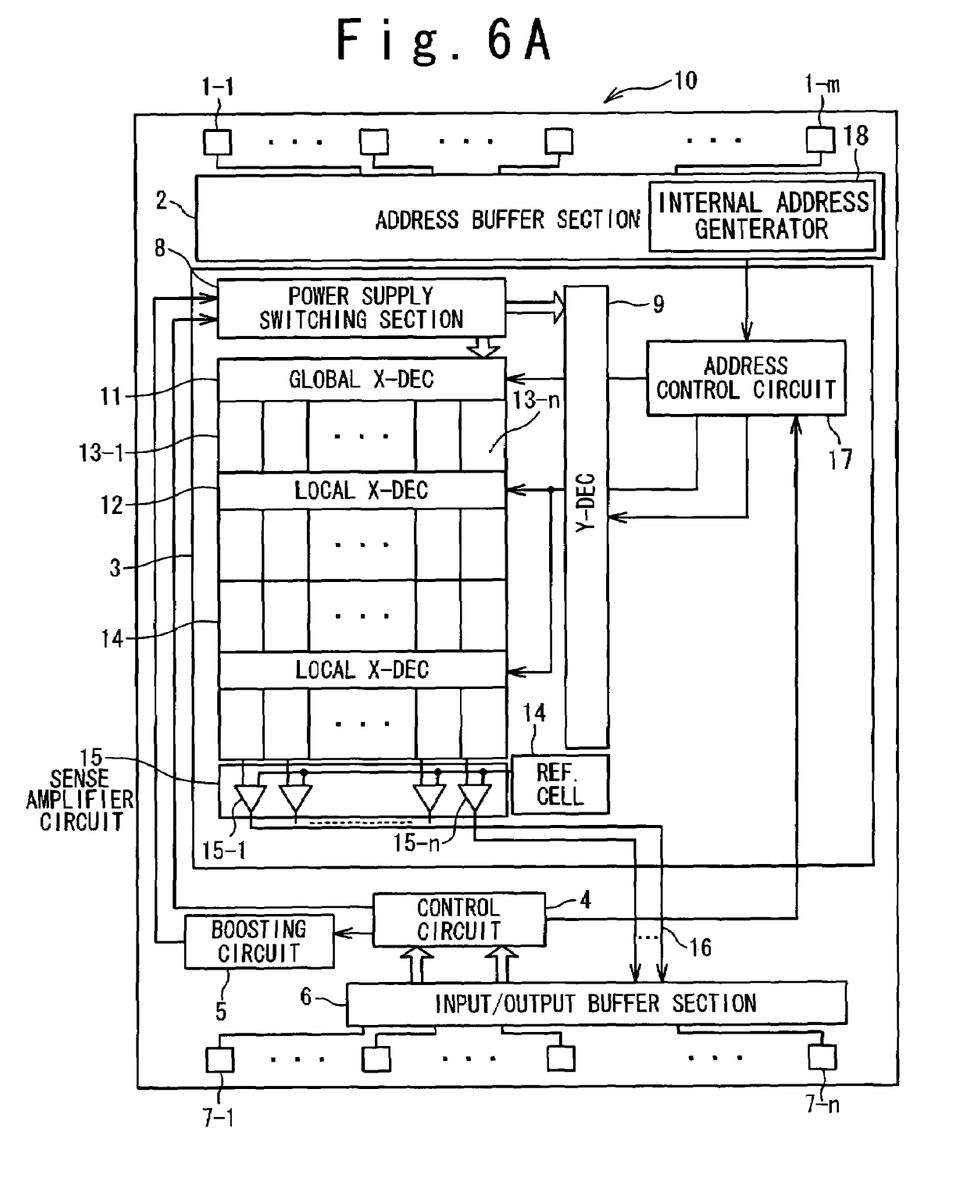
FIG. 6A is a block diagram showing a nonvolatile semiconductor memory according to a first embodiment of the present invention.
Figure 6B:
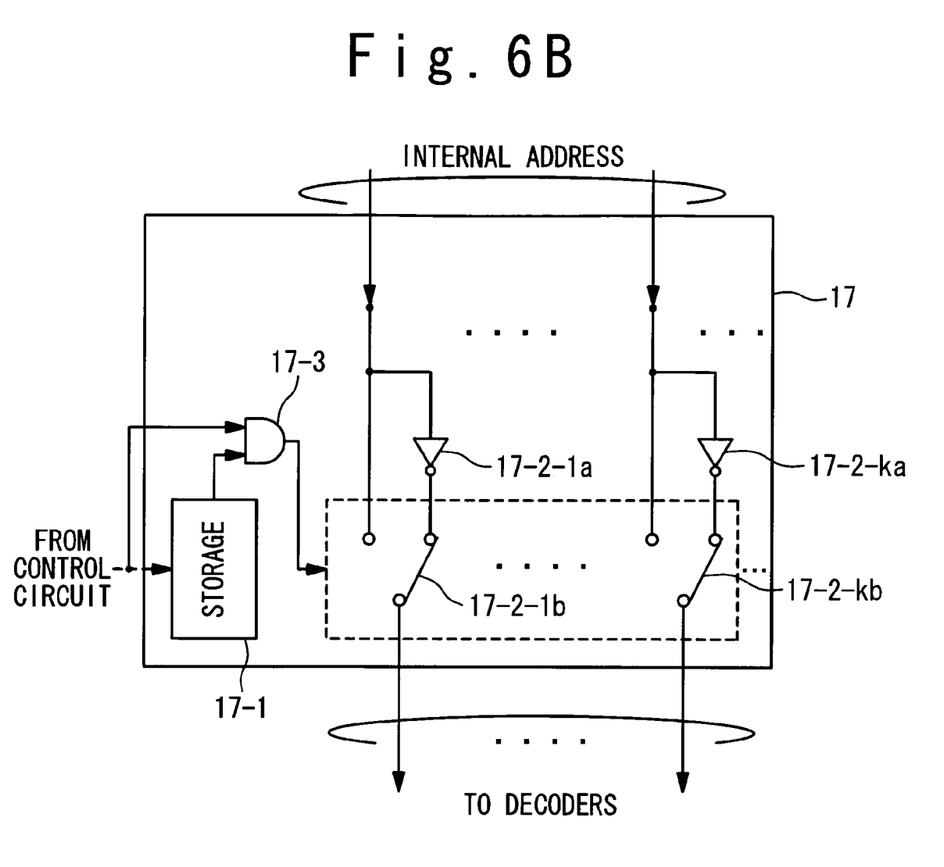
FIG. 6B is a block diagram showing an address control circuit in the nonvolatile semiconductor memory according to the first embodiment.
Figure 6C:
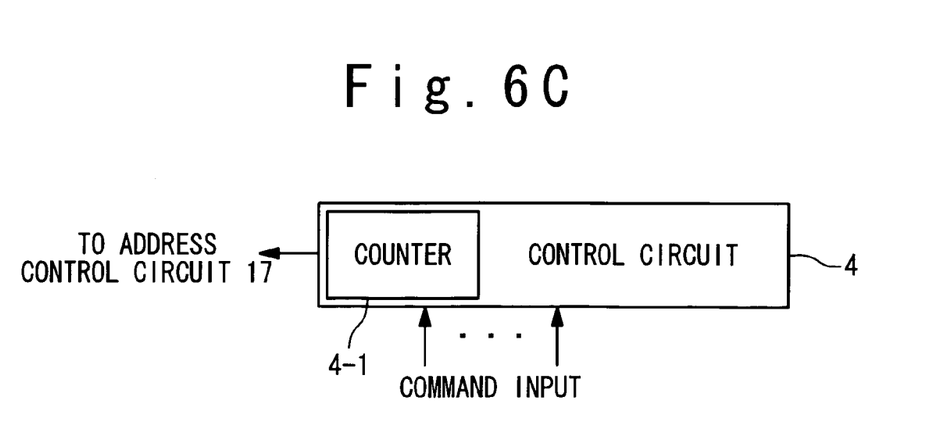
FIG. 6C is a block diagram showing a control circuit in the nonvolatile semiconductor memory according to the first embodiment.
Figure 7A:
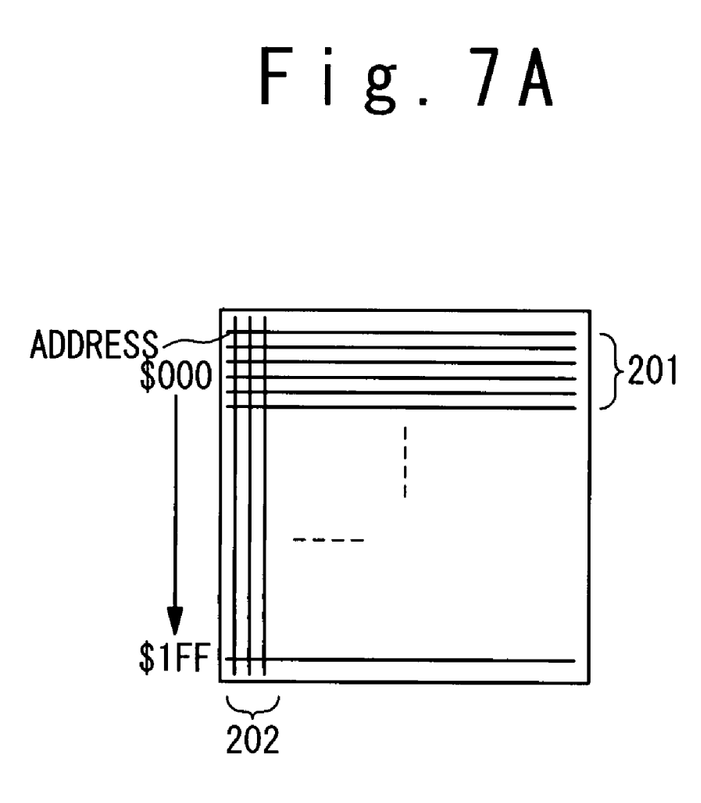
FIGS. 7A and 7B are diagrams showing change examples of the addresses allocated to memory cells of a memory cell array.
Figure 7B:
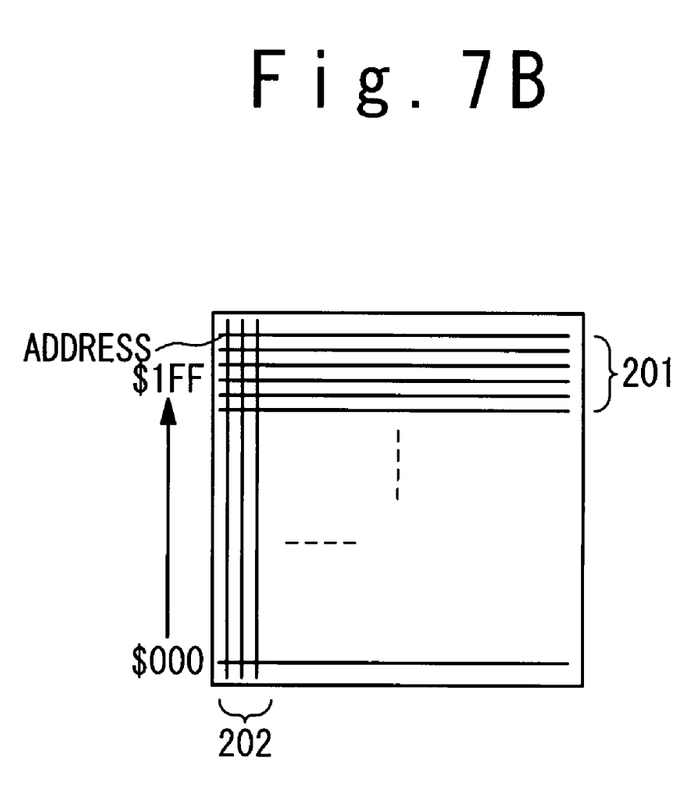
Figure 7C:
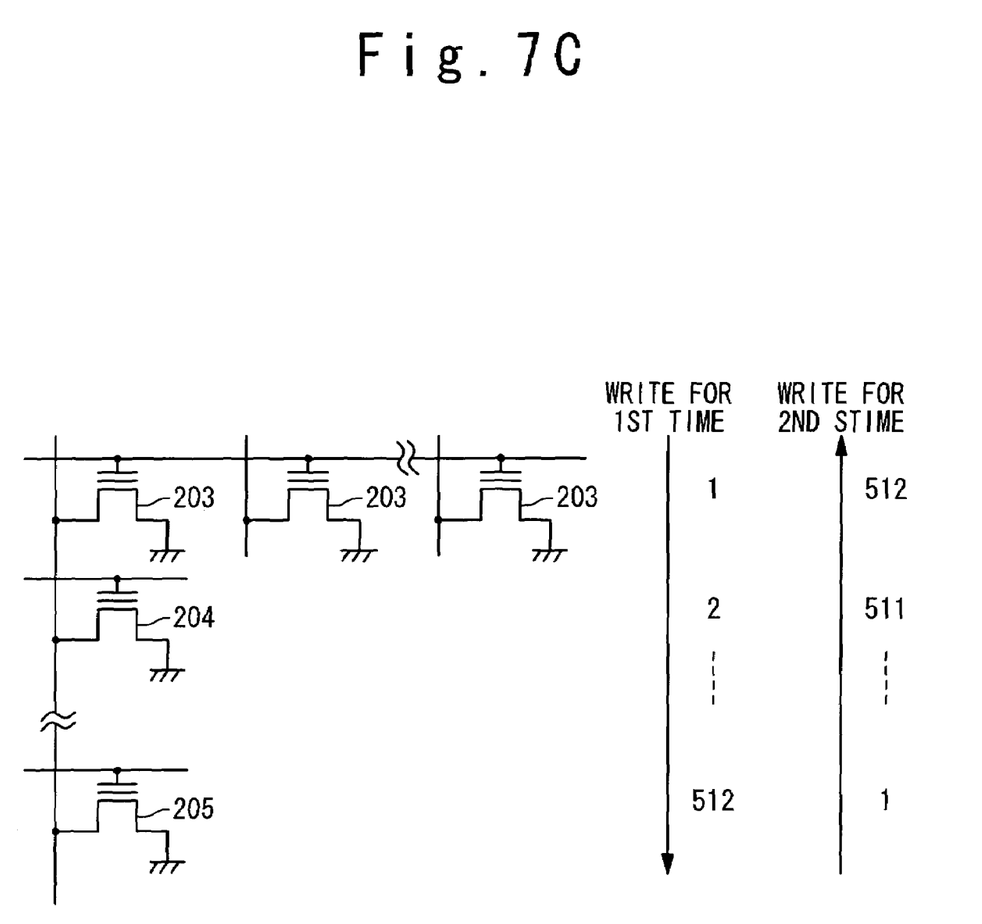
FIG. 7C is a diagram showing an outline of 512 memory cells of the array for one bit line.

Hereinafter, a nonvolatile semiconductor memory of the present invention will be described in detail with reference to the attached drawings. FIG. 6A is a block diagram showing the nonvolatile semiconductor memory according to the first embodiment of the present invention. FIG. 6B is a block diagram showing an address control circuit in the nonvolatile semiconductor memory according to the first embodiment of the present invention, and FIG. 6C is a block diagram showing a control circuit in the nonvolatile semiconductor memory according to the first embodiment of the present invention. FIGS. 7A and 7B are diagrams showing change examples of the addresses allocated to memory cells of a memory cell array. FIG. 7C is a diagram showing an outline of 512 memory cells of the array for one bit line, and the examples of the data write order.

FIG. 6A is a block diagram showing a configuration of a flash memory as the nonvolatile semiconductor memory of the present invention. A flash memory 10 is provided on a semiconductor chip. The flash memory 10 includes an address buffer section 2, a plate 3, an output bus section 16, an input/output buffer section 6, and a control circuit 4, a boosting circuit 5. Terminals 1-1 to 1-$m$ ($m$ is an integer of one or more) are connected with the address buffer section 2. The address buffer section 2 includes an internal address generator 18 to generate an internal access address or internal access addresses based on an external address supplied through the terminal 1-1 to 1-$m$. The internal access address is adaptive to a signal level of an internal circuit. The internal access address is supplied to the plate 3.

The plate 3 is a unit of a functional block of the flash memory 10, and includes a memory cell array 14, a global row decoder 11, local row decoders 12, a column decoder 9, a sense amplifier circuit 15, a reference cell section 14, a power supply switching section 8, and an address control circuit 17. In this example, the address control circuit 17 is provided in the plate 3, but may be provided outside the plate 3. The memory cell array 3 includes a plurality of memory cells in a matrix of rows and columns. The memory cells are connected with word lines and column lines, and are divided into sectors 13-$i$ ($i$=1 to n). Each of the sectors 13-$i$ is a minimum unit for an erasing operation of the stored data, and includes a plurality of the memory cells.

The address control circuit 17 generates an internal address from the internal access address. The internal address includes a row address and a column address. The row address is supplied to the global decoder 11 and the local row decoders 12 which selects one of the word lines based on the row address. The column address is supplied to the column decoder 9, which selects one of the bit lines based on the column address. The sense amplifier circuit 15 includes sense amplifiers 15-$i$ which are provided for the sectors 13-$i$¥, respectively. The sense amplifier circuit 15 senses data from a memory cell specified by the selected word line and the selected bit line to output a data output signal, or writes data in the specified memory cell. The sense amplifiers 15-$i$ are connected with the input/output buffer section 6 through the output bus section 16. Terminals 7-$i$ ($i=1, \ldots, n$) are connected with the input/output buffer section 6.

The data output signal is supplied from the sense amplifier circuit 15 to the input/output buffer section 6 through the data output section 16. The input/output buffer section 6 adjusts the signal level of the data output signal in accordance with an external signal level and generates an output data. Then, the input/output buffer section 6 outputs the output data outside the flash memory 10 through the terminals 7-$i$. The control circuit 4 receives a control data from the terminal 7-$i$ through the input/output buffer section 6.

The control circuit 4 determines an operation to be carried out by the flash memory 10 based on the control data. Then, the control circuit 4 generates control signals. The control circuit 4 supplies the control signals to the boosting circuit 5, the memory cell array 3, the address control circuit, the output bus section 16, and the address buffer section 2, to control the flash memory 10. When receiving an erase instruction as the control data, the control circuit 4 sets a write/erase mode and generates a write/erase control signal to carry out a write operation and an erase operation subsequent to the write operation. The write/erase control signal is supplied to the address control circuit 17. As shown in FIG. 6C, the control circuit 4 includes a counter to count the number of times of the erase instruction. The control circuit 4 outputs the count value to the address control circuit 17. The boosting circuit 5 supplies the boosted power supply voltages to the memory cell array 3. The power supply switching section 8 switches a voltage to be supplied between the power supply voltages from the boosting circuit 5 in response to a control signal from the control circuit 4, and supplies the voltage to the global row decoder 11 and the column decoder 9.

As shown in FIG. 6B, the address control circuit 17 has a storage unit 17-1, an address switching section 17-2 and a logic circuit 17-3. The storage unit 17-1 stores the count value supplied from the control circuit 4. An AND gate as the logic circuit 17-3 generates a switch control signal to control the address switching section 17-2 based on at least a part of the count value stored in the storage unit 17-1 and the write/erase control signal from the control circuit 4. The address control circuit 17 is connected with m address lines. Each of address lines on an input side to the address switching section 17-2 corresponding to the column address is connected directly with one contact of a switch 17-2-$kb$ ($k=1, 2, \ldots, m$) of the section 17-2, and is connected with the other contact of the switch 17-2-$kb$ through an inverter 17-2-$ka$. Each of address lines on an output side of the address switching section 17-2 corresponding to the column address is connected with the column decoder 9. Each of address lines on the input side to the address switching section 17-2 corresponding to the row address is connected directly with a corresponding one of the address lines on the output side of the address switching section 17-2 corresponding to the row address. The address switching section 17-2 includes a plurality of switches for the column address. Each switch 17-2-$sb$ ($s=1$ to $k$: $k$ is the number of bits of the column address) is controlled based on the switch control signal from the logic circuit 17-3. The switch 17-2-$sb$ selects an inverted address bit as the output from the inverter in the write/erase mode, and selects the non-inverted address bit in other modes.

In the memory cell array shown in FIG. 7A, each memory cell is arranged in an intersection of the word lines 201 and the bit lines 202. Addresses from $000 to $1FF are allocated to 512 memory cells on one bit line. In the memory cell array shown in FIG. 7B, the order of the allocated addresses is nominally reversed. Also, as shown in FIG. 7C, 512 memory cells are arranged on the bit line in the order of the first memory cell 203, the second memory cell 204, . . . , and the $512^{th}$ memory cell. There are two kinds of the data write order. One kind of the data write order is a positive direction, i.e., the order from the first memory cell 203 to the $512^{th}$ memory cell 205 in the first writing operation, and the other is an opposite direction, i.e., the order from the $512^{th}$ memory cell 205 to the first memory cell 203 in the second writing operation.

Next, an operation of the nonvolatile semiconductor memory in the first embodiment will be described below. The storage unit 17-1 stores the count value that indicates the number of times of the erasing operation to the memory cell array 101. The AND circuit 17-3 calculates a logical product of at least a part of the count value stored in the storage unit 17-1, e.g., a lest significant bit of the count value in this example, and the write/erase control signal. Thus, the non-inverted row address is supplied to the global row decoder 11 and the local row decoders 12, and the inverted column address is supplied to the column decoder 9. Like this example, when the write address order is switched for every erasing operation, it is determined that the number of times of the writing operation is even, if the lest significant bit of the data stored in the storage unit 17-1 is "1". In this case, the write operation is carried out in accordance with the write address order shown in FIG. 7A, and the writing operation is carried out in the positive direction as shown in FIG. 7C. Also, it is determined that the number of times of the writing operation is odd if the lest significant bit of the data stored in the storage unit 17-1 is "0". In this case, the write operation is carried out in accordance with the write address order shown in FIG. 7B, and the writing operation is carried out in the opposite direction as shown in FIG. 7C.

As mentioned above, the write address order is switched each time the erasing operation is carried out to the memory cell array, to reverse the write address order in the next writing operation. For instance, it is supposed that the writing/erasing operations are repeated 10,000 times when the 512 memory cells are on one bit line as show in FIG. 7C. In this case, the first memory cell 203 of the address $000 in the conventional example receives the stress of 511*10,000 times*(the average write time per one memory cell) in maximum. In the present invention, the stress becomes {(511*5,000 times)+(0*5,000 times)}*(the average write time per one memory cell). Thus, the first memory cell 203 has been conventionally received the severest damage in the severest condition, that is, when the writing/erasing operations are carried out to all the memory cells on the same bit line. The stress of the first memory cell 203 has been 5,110,000 times*the write time in total. However, in the present invention, the stress is reduced to a half, i.e., 2,555,000 times*the write time. The stress in the second memory cell 204 is {(510*5,000 times)+(1*5,000 times)}×(the average write time per one memory cell). The stress in the $512^{th}$ memory cell 205 is {(509*5,000 times)+(2*5,000 times)}×(the average write time per one memory cell). As a result, the damage of the hole injection is uniformed in all the memory cells on the same bit line.

In this way, according to the nonvolatile semiconductor memory of the present invention, the damage due to each writing/erasing operations can be reduced to a half by reversing the write address order in the severest condition, i.e., when the writing/erasing operations are carried out to all the memory cells on the same bit line. Moreover, it is possible to prevent the damage from being applied to a specific memory cell ununiformly. Therefore, the reliability of the nonvolatile semiconductor device can be improved remarkably in the present invention.

In the above embodiment, the address write order is reversed each time the erasing operation is carried out once. However, even if the write address order is reversed each time the erasing operation is carried out twice or more, the same effect can be obtained to average the damage of the hole injection over all the memory cells on the same bit line. Also, the reliability of the nonvolatile semiconductor device can be also improved in the present invention.

In the above description, the damage of the memory cells on the same bit line has been described. However, the damage due to the write operation occurs also in the memory cells on the same word line. At this time, the damage through electron injection is applied on the memory cells in which no data is written. In this case, the write address order may be reversed each time the erasing operation is carried out to all the memory cells on the same word line once or more. Thus, the damage due to the electron injection can be uniformed. When the write address order of both of the bit line and word line are reversed each time the erasing operation is carried out once or more, the damages of the memory cells due to the hole and electron injection can be averaged. As a result, the reliability of the nonvolatile semiconductor memory is further improved in the present invention.

In the above description, the least significant bit is used for the inversion of the address. However, when the lowest two bits are used, the write address order can be changed once per four times of the erasing operation. Thus, the frequency of order change can be optionally set.

Also, in the above description, only the column address is inverted in units of columns, while the row address is not inverted. However, only the row address can be inverted in units of rows if the inverters 14-2-*ka* and the switches 17-2-*kb* are provided for the row address. This is not shown since this configuration could be obvious to a person in the art. Also, all the address bits of the address may be inverted. In this case, the row address and the column address are both inverted. This is not shown since this configuration could be obvious to a person in the art.

What is claimed is:

1. A nonvolatile semiconductor memory comprising:
    a memory cell array in which a plurality of memory cells are arranged in a matrix of rows and columns;
    a control circuit configured to set a write/erase mode in response to erase instructions; and
    an address control circuit;
    wherein:
        said address control circuit is configured to produce write addresses to cause specific memory cells of the plurality of memory cells to be written in a certain write order when said write/erase mode is set by the control circuit in response to a first erase instruction; and
        said address control circuit is configured to produce write addresses to cause the specific memory cells to be written in a particular write order different from said certain write order when said write/erase mode is set by the control circuit in response to another erase instruction issued after said first erase instruction.

2. The nonvolatile semiconductor memory according to claim 1,
    wherein said particular write order is opposite to said certain write order in units of the rows of said memory cells.

3. The nonvolatile semiconductor memory according to claim 2,
    wherein said control circuit is configured to provide a count value based on a number of times said write/erase mode has been set,
    wherein said address control circuit is configured to produce write addresses from input addresses for write operations in said write/erase mode based on said count value,
    wherein said address control circuit is connected with address lines on which an input address having a row address portion and a column address portion is supplied, and
    wherein said address control circuit comprises:
        inverters connected to said address lines corresponding to said row address portion;
        a logic circuit configured to generate a switch control signal based on said count value in said write/erase mode; and
        switches, each of which outputs an inverted output of said inverter connected with a corresponding one of said address lines corresponding to said row address portion in response to said switch control signal.

4. The nonvolatile semiconductor memory according to claim 3,
    wherein said switches output said input address supplied on said address lines as an internal address when said write/erase mode is not set.

5. The nonvolatile semiconductor memory according to claim 1,
    wherein said particular write order is opposite to said certain write order in units of the columns of said memory cells.

6. The nonvolatile semiconductor memory according to claim 5,
    wherein said control circuit is configured to provide a count value based on a number of times said write/erase mode has been set,
    wherein said address control circuit is configured to produce write addresses from input addresses for write operations in said write/erase mode based on said count value,
    wherein said address control circuit is connected with address lines on which an input address having a row address portion and a column address portion is supplied, and
    wherein said address control circuit comprises:
        inverters connected to said address lines corresponding to said column address portion;
        a logic circuit configured to generate a switch control signal based on said count value in said write/erase mode; and
        switches, each of which outputs an inverted output of said inverter connected with a corresponding one of said address lines corresponding to said column address portion in response to said switch control signal.

7. The nonvolatile semiconductor memory according to claim 6,
    wherein said switches output said input address supplied on said address lines as an internal address when said write/erase mode is not set.

8. The nonvolatile semiconductor memory according to claim 1,
wherein said particular write order is opposite to said certain write order.

9. The nonvolatile semiconductor memory according to claim 8,
wherein said control circuit is configured to provide a count value based on a number of times said write/erase mode has been set,
wherein said address control circuit is configured to produce write addresses from input addresses for write operations in said write/erase mode based on said count value,
wherein said address control circuit is connected with address lines on which an input address having a row address portion and a column address portion is supplied, and
wherein said address control circuit comprises:
inverters connected to said address lines;
a logic circuit configured to generate a switch control signal based on said count value in said write/erase mode; and
switches, each of which outputs inverted outputs of said inverters in response to said switch control signal.

10. The nonvolatile semiconductor memory according to claim 9,
wherein said switches output said input address supplied on said address lines as an internal address when said write/erase mode is not set.

11. A method of driving a nonvolatile semiconductor memory, comprising:
providing a memory cell array in which a plurality of memory cells are arranged in a matrix of rows and columns;
setting a write/erase mode in response to a first erase instruction;
generating write addresses to cause specific memory cells of the plurality of memory cells to be written in a certain write order when the write/erase mode is set in response to the first erase instruction;
setting the write/erase mode in response to another erase instruction issued after said first erase instruction; and
generating write addresses to cause the specific memory cells to be written in a particular write order different from said certain write order when said write/erase mode is set in response to said another erase instruction.

12. The method according to claim 11,
wherein said particular write order is opposite to said certain write order in units of the rows of said memory cells.

13. The method according to claim 12, wherein said generating write addresses to cause the specific memory cells to be written in the particular write order, comprises:
inverting address bits of a row address portion of an input address; and
generating as a write address, the inverted address bits for said row address portion and non-inverted address bits for a column address portion in said write/erase mode.

14. The method according to claim 13, further comprising:
generating said input address as an internal address when said write/erase mode is not set.

15. The method according to claim 11,
wherein said particular write order is opposite to said certain write order in units of the columns of said memory cells.

16. The method according to claim 15, wherein said generating write addresses to cause the specific memory cells to be written in the particular write order, comprises:
inverting address bits of a column address portion of said input address; and
generating as a write address, non-inverted address bits for said row address portion and the inverted address bits for a column address portion in said write/erase mode.

17. The method according to claim 16, further comprising:
generating said input address as an internal address when said write/erase mode is not set.

18. The method according to claim 11,
wherein said particular write order is opposite to said certain write order.

19. The method according to claim 18, wherein said generating write addresses to cause the specific memory cells to be written in the particular write order, comprises:
inverting address bits of an input address; and
outputting as a write address the inverted address bits in said write/erase mode.

* * * * *